(12) United States Patent
Bergmann et al.

(10) Patent No.: US 7,668,233 B2
(45) Date of Patent: Feb. 23, 2010

(54) METHOD OF DETERMINING JITTER AND APPARATUS FOR DETERMINING JITTER

(75) Inventors: Ernest Eisenhardt Bergmann, Borough of Fountain Hill, PA (US); Jorge Eduardo Franke, Orefield, PA (US); John Sargent French, Palm, PA (US); William Joseph Thompson, Kempton, PA (US)

(73) Assignee: Circadiant Systems, Inc., Allentown, PA (US)

( * ) Notice: Subject to any disclaimer, the term of this patent is extended or adjusted under 35 U.S.C. 154(b) by 852 days.

(21) Appl. No.: 10/900,735

(22) Filed: Jul. 28, 2004

(65) Prior Publication Data

US 2006/0023778 A1    Feb. 2, 2006

(51) Int. Cl.
*H04B 17/00* (2006.01)
*H04L 7/00* (2006.01)

(52) U.S. Cl. ...................................... 375/224
(58) Field of Classification Search ................. 375/224, 375/226, 227, 355, 360, 371; 702/69; 714/704, 714/709, 819
See application file for complete search history.

(56) References Cited

U.S. PATENT DOCUMENTS

| | | | | |
|---|---|---|---|---|
| 5,566,088 | A | 10/1996 | Herscher et al. | 364/514 B |
| 5,652,668 | A | 7/1997 | Aulet | 359/110 |
| 5,726,991 | A * | 3/1998 | Chen et al. | 714/704 |
| 5,841,667 | A | 11/1998 | Martin | 364/551.01 |
| 6,076,175 | A * | 6/2000 | Drost et al. | 714/704 |
| 6,373,563 | B1 | 4/2002 | Stimple et al. | 356/73.1 |
| 6,522,122 | B2 * | 2/2003 | Watanabe et al. | 324/76.77 |
| 6,832,172 | B2 * | 12/2004 | Ward et al. | 702/69 |
| 6,934,648 | B2 * | 8/2005 | Hanai et al. | 702/69 |
| 6,959,060 | B2 * | 10/2005 | Jung | 375/372 |
| 7,080,292 | B2 * | 7/2006 | Moore et al. | 714/700 |
| 7,308,371 | B2 * | 12/2007 | Ong | 702/69 |
| 7,389,450 | B2 * | 6/2008 | Fleischer-Reumann et al. | 714/704 |
| 2002/0118738 | A1 * | 8/2002 | Whitlock | 375/226 |
| 2002/0136281 | A1 * | 9/2002 | Grohn | 375/219 |
| 2003/0169755 | A1 * | 9/2003 | Ternovsky | 370/412 |

(Continued)

OTHER PUBLICATIONS

Ronnie Neil, "Understanding Jitter and Wander Measurements and Standards", Agilent Technologies, Feb. 2003.*

*Primary Examiner*—Chieh M Fan
*Assistant Examiner*—Aristocratis Fotakis
(74) *Attorney, Agent, or Firm*—Matthew A. Pequignot; Pequignot + Myers LLC

(57) ABSTRACT

In accordance with illustrative embodiments, methods and apparati, which determine jitter are described. In one example embodiment, a method includes receiving a signal, wherein the signal comprises a first data pattern which was generated at a first bit rate. The method also includes sampling the signal at a second bit rate to generate a second data pattern. The period of the second bit rate is different from the period of the first bit rate. The method also includes comparing the first data pattern and the second data pattern to determine differences between the first data pattern and the second data pattern. Furthermore, the method includes determining jitter in the signal according to the differences between the first data pattern and the data second data pattern. In other embodiments, by using two different bit rates to determine jitter, jitter can be determined in communication systems in a convenient and cost effective manner.

13 Claims, 11 Drawing Sheets

U.S. PATENT DOCUMENTS

2004/0044948 A1* 3/2004 Moore et al. ................. 714/819
2004/0181714 A1* 9/2004 Jungerman .................. 714/704
2004/0252802 A1* 12/2004 Yamaguchi ................. 375/371
2004/0260492 A1* 12/2004 Halle et al. ................... 702/69
2005/0031029 A1* 2/2005 Yamaguchi et al. ......... 375/226
2005/0069031 A1* 3/2005 Sunter et al. ................ 375/224
2005/0111536 A1* 5/2005 Cranford et al. ............ 375/226
2005/0273320 A1* 12/2005 Yamaguchi et al. ......... 704/205

* cited by examiner

NO ERRORS    ERRORS

METHOD OF DETERMINING JITTER AND APPARATUS FOR DETERMINING JITTER

BACKGROUND

Telecommunications is an important part of everyday life. Examples of telecommunication systems are telephone systems, telegraph systems, radio broadcast systems, televisions systems, and cellular telephone systems. Since the advent of the first telecommunication system, telecommunication systems have improved the quality of life in many respects. Because of telecommunication systems, businesses can be conducted more efficiently and geographically separated family members can talk to each other on telephones.

Datacom is also an important part of everyday activity. It fosters communication between devices such as computers over various distances. In networking applications, many high speed applications may be aggregated, resulting in the need for very high speed digital communication.

Many telecommunication and datacom systems use fiber optics to send information from one place to another at a high speed. This high speed communication over fiber optics is beneficial, as a large capacity of communication can be handled by a single optical fiber. For example, a single optic fiber is capable of carrying thousands of telephone conversations at the same time. Even over short distances, high-speed serial communications are often used, resulting in the need for high-speed signaling requiring low jitter performance.

Throughout the development of optic fiber communications, engineers have attempted to increase the capacity of a single optical fiber. When attempting to increase the capacity of an optical fiber communication system, many factors can limit the speed at which information can be communicated. Aside from limitations of optical fiber, other communication components can limit the communication capability of the optical fiber. In general, an optical communication system may include components such as optical fiber, transmitters, receivers, amplifiers, couplers, splitters, and other devices or materials.

Often times, an optical communication system or a non-optical communications system is limited by a phenomenon called jitter. Jitter occurs when there is a timing looseness introduced by the components of a communication system. In order to minimize this jitter problem, it is useful to be able to detect the amount of jitter present in a communication component or system. Further, it is desirable to be able to detect jitter in a communication component or system in an efficient and cost effective manner. A related problem is known as 'wander.' Wander is jitter at relatively low frequencies.

SUMMARY

In accordance with illustrative embodiments, methods and apparati, which determine jitter are described. In one example embodiment, a method includes receiving a signal, wherein the signal comprises a first data pattern that was generated at a first bit rate. The method also includes sampling the signal at a second bit rate to generate a second data pattern. The period of the second bit rate is different from the period of the first bit rate. The method also includes comparing the first data pattern and the second data pattern to determine differences between the first data pattern and the second data pattern. Furthermore, the method includes determining jitter in the signal according to the differences between the first data pattern and the data second data pattern. In other embodiments, by using two different bit rates to determine jitter, jitter can be determined in communication systems in a convenient and cost effective manner.

In accordance with another example embodiment, a tester comprising a test clock. The tester is configured to receive a signal, wherein the signal comprises a first data pattern, which was generated at a first bit rate. The tester is also configured to sample the signal at a test bit rate of the test clock to generate a second data pattern, wherein the test bit rate is different from the first bit rate; compare the first data pattern and the second data pattern to determine differences between the first data pattern and the second data pattern; and determine jitter characteristics in the signal according to the differences between the first data pattern and the second data pattern.

BRIEF DESCRIPTION OF THE DRAWINGS

FIGS. 9A-9G show an illustrative data pattern that is slightly over-sampled in accordance with an example embodiment.

FIGS. 10A-10H show an illustrative data pattern that is slightly under-sampled in accordance with an example embodiment.

DETAILED DESCRIPTION OF THE INVENTION

Figure 1A:
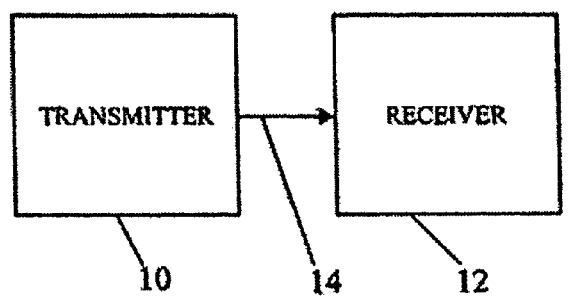
FIGS. 1A-1C are schematic diagrams of transmitters, receivers, amplifiers, and communication mediums according to an example embodiment.

In the following detailed description, for purposes of explanation and not limitation, example embodiments disclosing specific details are set forth in order to provide a thorough understanding of the present invention. However, it will be apparent to one having ordinary skill in the art having had the benefit of the present disclosure that the present invention may be practiced in other embodiments that depart from the specific details disclosed herein. Moreover, descriptions of well-known devices and methods may be omitted so as to not obscure the description of the present invention. Finally, wherever practical, like reference numerals refer to like features.

FIG. 1A is schematic diagram of transmitter 10 connected to receiver 12 through medium 14. In example embodiments, transmitter 10 can be either an optical transmitter, a wireless transmitter, or a wireline transmitter. Likewise, in example embodiments, receiver 12 can be either an optical receiver, a wireless receiver, or a wireline receiver. Depending on the type of system, in embodiments, medium 14 can either be an optical medium (e.g. fiber optics), a wireless medium (e.g. air), or wireline medium (e.g. copper wire). Transmitter 10 may output digital data to medium 14. Receiver 12 may receive the digital data from medium 14. Transmitter 10 and receiver 12 may be located a significant distance from each other. In example embodiments, the transmitter 10 and the receiver 12 may be of the type found in serial digital communication links, and are within the purview of one of ordinary skill in the art.

Figure 1B:
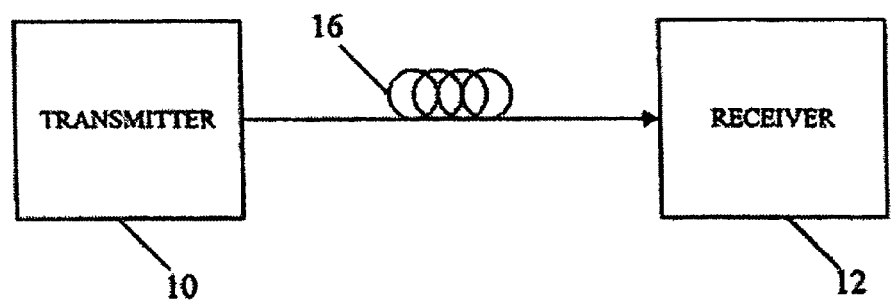

FIG. 1B is an exemplary illustration of transmitter 10 and receiver 12 connected by optical fiber 16. Transmitter 10 may include a laser which generates light pulses. The light pulses may be input into optical fiber 16. Optical fiber 16 may carry those light pulses to receiver 12. The light pulses may be input into receiver 12 and regenerated into useful information. Although optical fiber 16, as an optical medium, as illustrated, one of ordinary skill in the art can appreciate the many other different types of mediums that can be used (e.g. copper wire or airwaves).

Figure 1C:
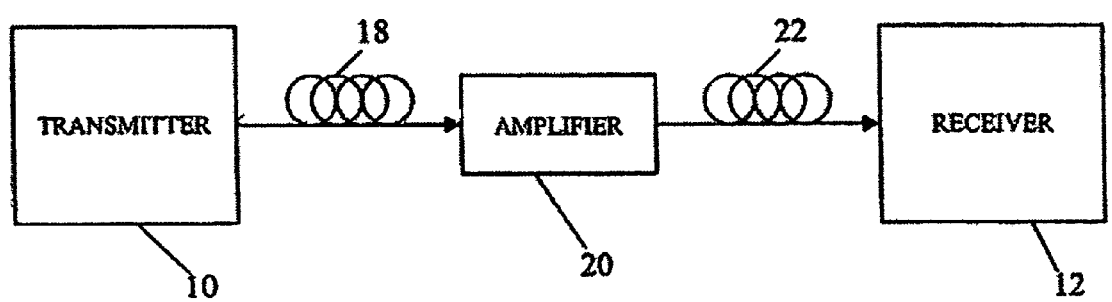

FIG. 1C is an exemplary illustration of transmitter 10 coupled to receiver 12 through optical fiber 18, optical fiber 22, and amplifier 20. The distance that a optical signal travels in an optical fiber may be far. However, after some length (e.g. several hundred miles) of optical fiber, the light signal becomes very weak. In circumstances where the distance between the transmitter and receiver in an optical communication system is very long (e.g. hundreds of miles), an amplifier (e.g. amplifier 20), which is often referred to as a repeater, may be utilized. Transmitter 10 may output light pulses into optical fiber 18. Prior to the optical pulses' being too attenuated (i.e. weakened in power), the signal is received in amplifier 20. Amplifier 20 increases the power of those optical signals and then inputs the amplified light pulses into optical fiber 22. Receiver 12 then receives the light pulses from optical fiber 22 and converts them into useful information. One of ordinary skill in the art can appreciate that many amplifiers may be utilized depending on the distance between transmitter 10 and receiver 12. Likewise, one of ordinary skill in the art can appreciate that other mediums besides optical fiber may be utilized and/or that regenerators can be used instead of amplifiers.

Figure 2A:
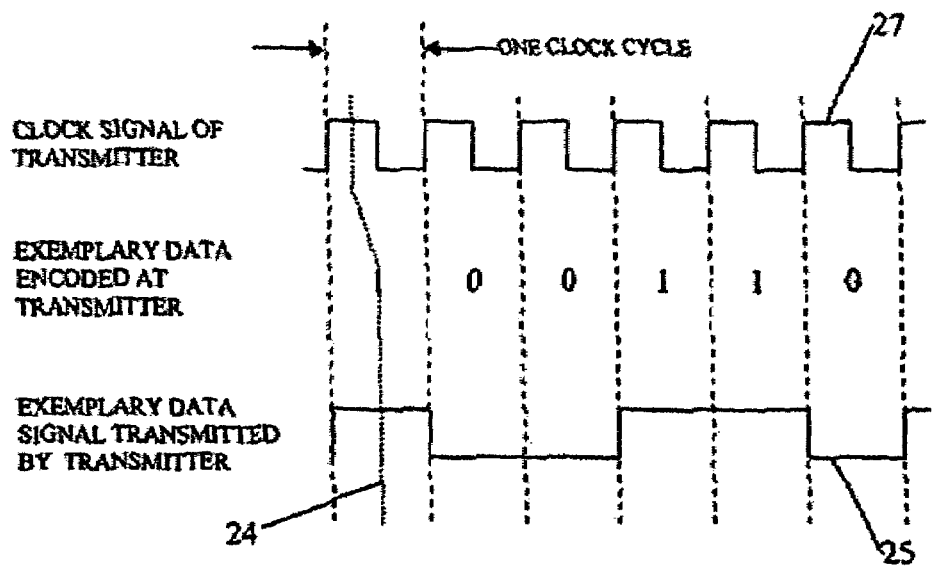
FIGS. 2A-2B and 3A-3B are timing diagrams of data signals and clock signals in transmitters and receivers according to example embodiments.
Figure 2B:
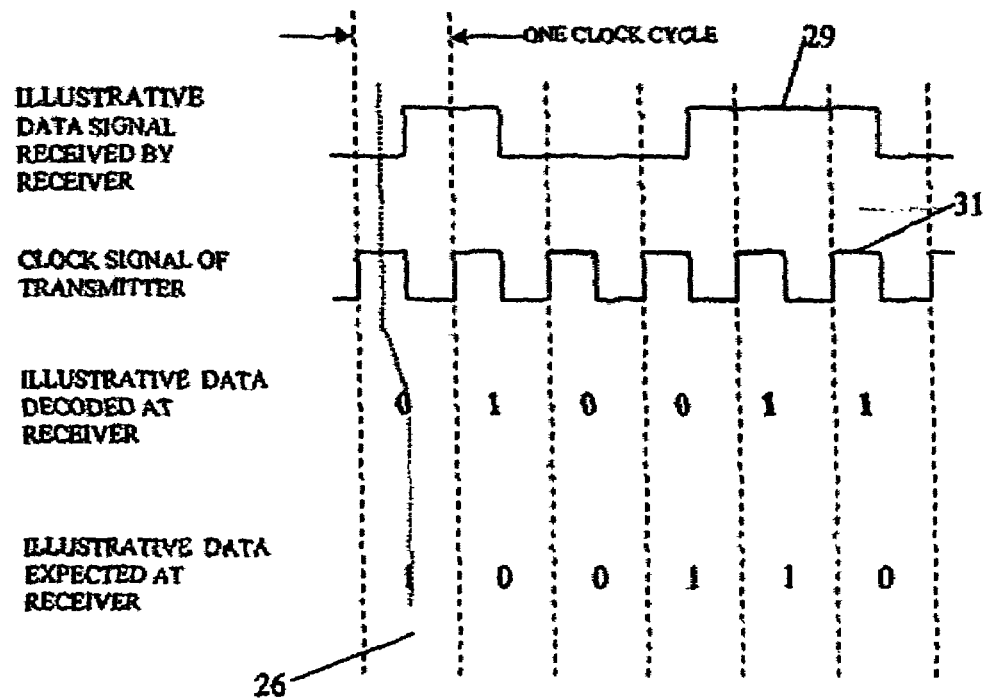

FIGS. 2A and 2B are timing diagrams of signals at transmitters and receivers (e.g. transmitter 10 and receiver 12) of example embodiments. In certain example embodiments, the signals transmitted between a transmitter and a receiver are digital signals. For example, in FIG. 2A, digital signal 25 is a representation of the binary data pattern "100110". The data pulses of signal 25 are driven by clock signal 27. Each clock cycle triggers a pulse of data signals 25. For example, highlighted line 24 is the relationship between clock signal 27, the data value "1", and the high-level pulse of data signal 25. The high-level pulse of data signal 25 may be triggered by the rising edge of the clock signal 27. In embodiments, the data signal "100110" is part of a data signal. The "100110" may represent a small piece of information which is relevant. For example, the sequence "100110" may represent a small portion a voice telephone conversation.

FIG. 2B is an example timing diagram of the example data signal "100110" received at a receiver (e.g. receiver 12). As shown in FIG. 2B, there is a timing offset between data signal 29 (which is the same as data signal 25 of FIG. 2A) and clock signal 31. Because of this offset, the data interpreted at the receiver may be erroneous. For example, instead of the correct sequence "100110" being received, the incorrect sequence "010011" is received. Such a reception error may normally make the information received irrelevant and not useful. For example, if the correct data to be received were "100110" and the data actually received was "010011", then the data would be misinterpreted. If this were a signal in a telephone system, a portion of a telephone conversation may not be able to be understandable by an end user. As will become clearer as the present description continues, this erroneous data can become, relevant and useful.

Figure 3A:
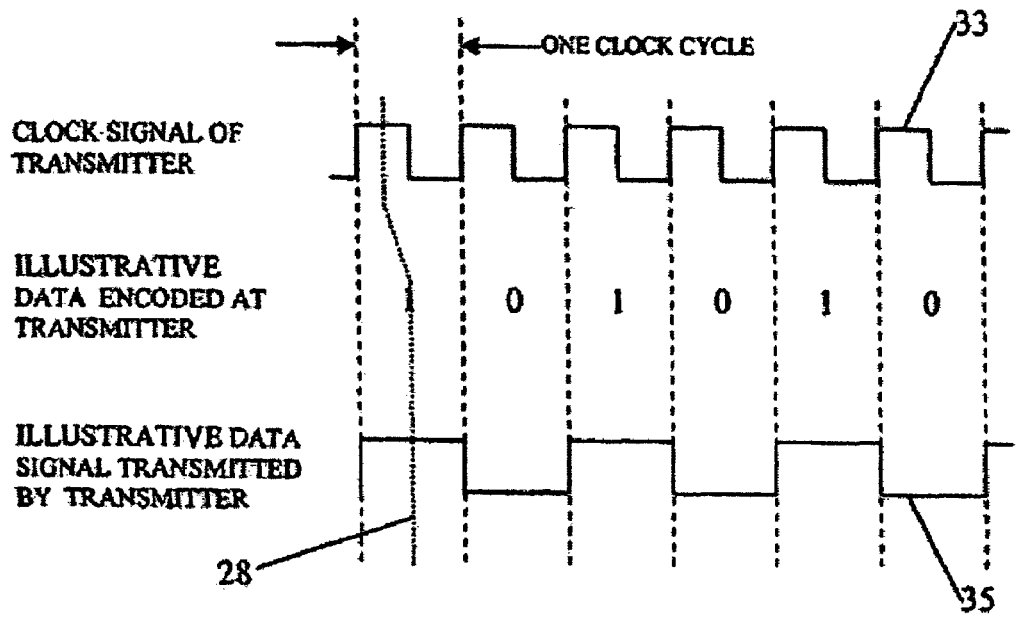
Figure 3B:
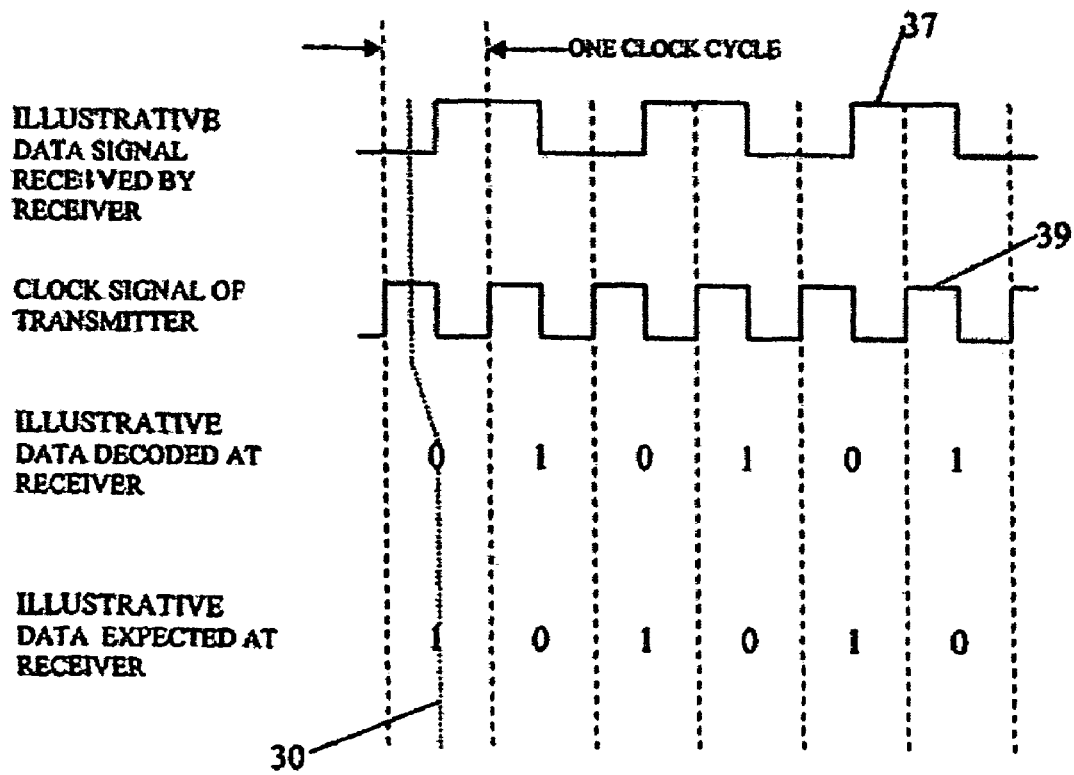

FIGS. 3A and 3B are similar to FIGS. 2A and 2B, except that the underlying data are a pattern of alternating "1"s and "0"s. For example, it can be seen in FIG. 3A the data encoded is a pattern of "101010". This data is encoded as example data signal 35 according to clock cycle 33. As shown by highlighting line 28, the first "1" is encoded according to rising edge of the clock signal 33.

In FIG. 3B, a mismatch is shown between the timing of clock signal 39 and example data signal 37, which is received by a transmitter. Example data signal 35, transmitted by a transmitter in example FIG. 3A is essentially the same as the example data signal 37 received at a receiver. However, there is a mismatch (i.e. phase difference) between example data signal 37 and receiver clock signal 39. As shown by line 30, due to the phase difference, a "0" is decoded from the signal 37 at the leading edge of clock cycle 39. However, this value should be a "1". These errors continue for the remainder of the bits of example data signal 37. In other words, the correctly received signal should be "101010". However, the signal actually received was "010101". Accordingly, a mismatch of the clock signal and example data signal 37 causes erroneous results. In the example patterns of FIGS. 2A and 2B, the only time a data bit was correctly received is when two data bits in a row of the original signal was the same. In other words, in example FIGS. 2A and 2B, the only time when there were bits received error-free, even when there was a mismatch of the clock signal and the data signal, was where the data bits overlapped by coincidence.

These errors in received data may cause problems. When data is not correctly received, the data signal received gets incorrectly interpreted. Incorrect interpretation leads to miscommunication. For example, if jitter is present in a digital telephone signal certain portions of data are not correctly received, and certain portions of the telephone conversation will not be audible by the end user.

Figure 4A:
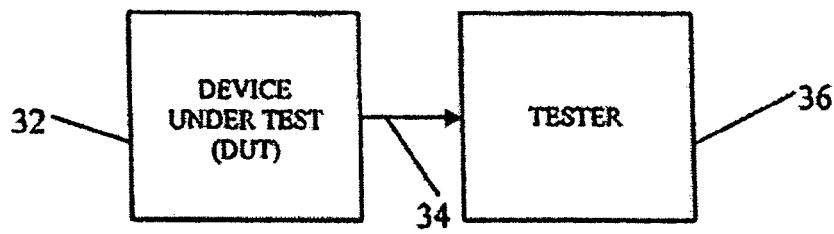
FIGS. 4A-4D are schematic diagrams of devices under test coupled to testers according to an example embodiment.
Figure 4B:
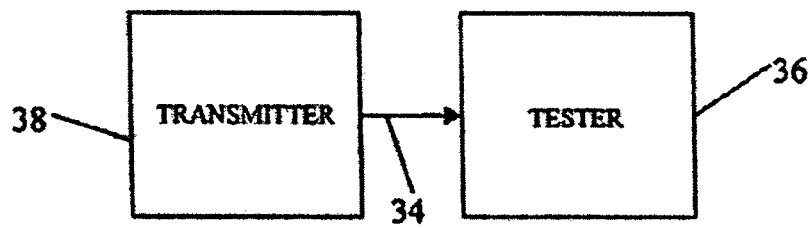
Figure 4C:
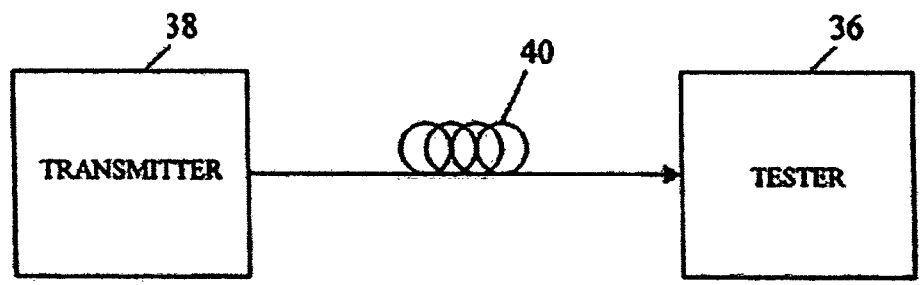

FIG. 4A is an illustration of tester 36 connected to device under test (DUT) 32 through medium 34 in accordance with an example embodiment. Tester 36 may be configured to test, among other things, the jitter produced by DUT 32. As illustrated in example FIG. 4B, in embodiments, DUT 32 may be transmitter 38. As illustrated in example FIG. 4C, the medium between transmitter 38 and tester 36 may be optical fiber 40. However, one of ordinary skill in the art would appreciate that other media may be used, such as a wireless medium or a wired medium.

Figure 4D:
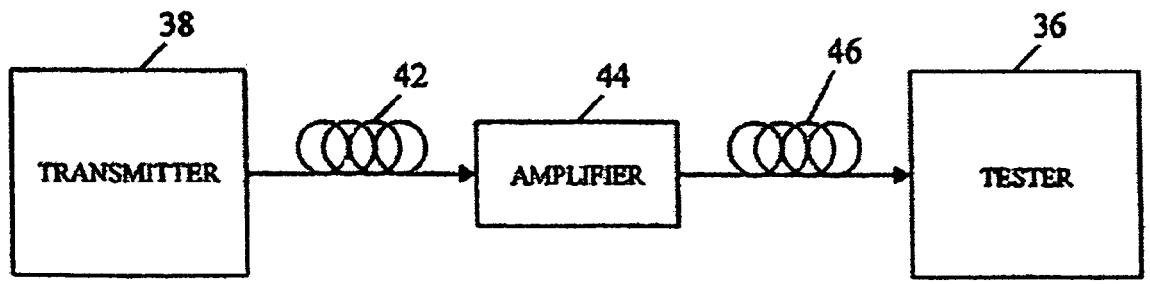

In certain example embodiments, as illustrated in FIG. 4D, medium 34 may include a first fiber optic medium 42 coupled in between transmitter 38 and amplifier 44. A second optical fiber medium 46 may be coupled between amplifier 44 and tester 36. In these illustrative embodiments, the amplifier serves to boost an optical signal when it is transmitted over a long distance, so it may be received at tester 36. One of ordinary skill in the art can appreciate that other types of amplifiers, transmitters, receivers, and other communication components may be used in conjunction with other types of media. Further, one of ordinary skill in the art can appreciate that other devices may be tested aside from a transmitter, an amplifier, and/or a communication medium. For example, a receiver may be a device under test (DUT) with similar configurations. In embodiments, it may be desirable to test more than one device for jitter. For instance, an entire system (e.g. including a transmitter, mediums, and amplifiers) may cause jitter as a collective group. Accordingly, as illustrated in example FIG. 4D, it may be desirable for tester 36 to be connected to the end of a series of communication components.

Figure 5A:
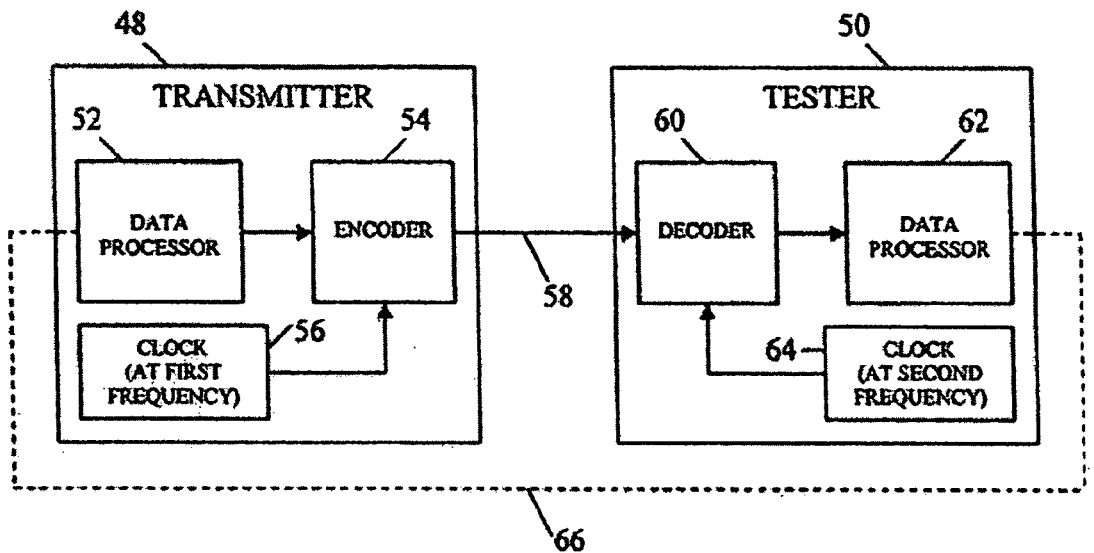
FIGS. 5A-5C are schematic diagrams of testers, transmitters, and receivers according to example embodiments.

FIG. 5A is an illustration of tester 50 coupled to transmitter 48 through interface 58 according to an example embodiment. Interface 58 may be a direct connection between the transmitter and tester. However, in example embodiments, interface 58 may include other components such as media, amplifiers, couplers, and other passive and active communication devices. Transmitter 48 may include data processor 52. Likewise, tester 50 may include data processor 62. Data processors 52 and 62 may perform a multitude of functions (e.g. controlling the operation components of the transmitter and tester). Transmitter 48 may include other components aside from encoder 54 and clock 56, which may be controlled or utilized by data processor 52. Likewise, tester 50 may include other components aside from decoder 60 and clock 64, which may be controlled or utilized by data processor 62.

During testing of transmitter 48 and/or interface 58, data processor 62 may be in communication with data processor 52. Although there may be some bidirectional communication between data processor 52 and data processor 62, data processor 62 usefully controls data processor 52 to send data in a specific manner to tester 50 through interface 58. The communication between data processor 52 and data processor 62 may be separate from communication interface 58. However, in some example embodiments, communication interface 58 may be utilized to communicate between data processor 62 and data processor 52. Further, in some example embodiments, communication between data processor 62 and data processor 52 may not be automated. For example, software programs may be input into transmitter 48 and/or tester 50 by a user in order to perform certain tasks at a particular time.

In known structures, where the clock rates on the transmit side and the received side are related, data processor 62 communicates to data processor 52 a test data pattern with instructions to transmit the test data pattern to the tester 50 through interface 58 at a specified time. By having tester 50 control transmitter 48, the tester can adequately test a signal, because tester 50 can anticipate the data that should be received. Unfortunately, errors occur at a very infrequent rate. For example, it may take many hours for a single error to occur. When testing devices, there may practically not be many hours to spare to test a device for jitter. However, according to example embodiments of FIG. 5A, clock 64 of tester 50 is configured differently than clock 56. To wit, clock 64 is set at a different frequency than clock 56. By setting clock 56 and clock 64 at different frequencies, errors due to jitter can be more detectable in a relatively short period of time.

In some other embodiments, data processor 52 communicates to processor 62 the pattern it has chosen to send. In example embodiments of FIG. 5A, data processor 62 sends a test data pattern or an algorithm to generate data to data processor 52 through communication path 66. Data processor 62 also may set the frequency of clock 64 according to the frequency of clock 56. For example, the clock frequency of clock 64 may have typically 1% difference the frequency of clock 56. However, one of ordinary skill in the art can appreciate that other deviations in clock frequencies may be used. The data pattern or algorithm stored in data processor 52 may then be encoded at encoder 54, according to the clock frequency of clock 56. The encoder causes a test data signal to be output into interface 58 with a frequency of clock 56. The decoder 60 of tester 50 decodes the data transmitted according to a frequency of clock 64. Accordingly, the decoder 60 outputs a data pattern to data processor 62 that have some similarities to the test data pattern encoded by encoder 54. However, because the frequency of clock 64 is different from the frequency of clock 56, it is anticipated that there will some amount of errors.

In keeping with an example embodiment, the sampling rate, "SR", could be at approximately half of the transmission rate, "TR". In this case, the expected samples would look like the sent pattern, but only every second bit seen. As such, if 2*SR is 1% different from TR, the jitter could be resolved to 1/50 UI because there are approximately 2 UI between samples. Thus to get the same resolution of jitter, these should be 0.5% between 2*SR and TR. It is possible to use other approximate ratios of SR and TR. Fox example, n*SR=TR±(1%/n), where n is some positive integer, may be used in order to obtain jitter resolution of 1/100 of a UI. Further, a generalization of this formula provides resolution of a fraction (f) of a UI. Quantitatively, this may be represented as: n*SR=TR±TR(f/n).

The sampling ratio use need not be approximately integer. It is possible, for example, to use: n*SR≈m*TR, where m and n are positive integers. To compare the two bit sequences, at every $m^{th}$ sampled bit is studied to match with every $n^{th}$ transmitted bit.

The special case where the transmitted bit stream is a PRBS (pseudo-random bit sequence), the samplings of this stream every $2^p$ bits will again result in a PRBS pattern. Thus, the techniques often employed to recognize received PRBS patterns and to detect errors in such patterns can still be applied in keeping with example embodiments.

For an illustrative 1% difference in frequency, one can expect that the clocks will slip by each other on the average every 100 bits. Then one could resolve the degree of jitter to 1/100 of a UI (Unit Interval, the time to transmit one Baud interval). Thus the jitter is resolvable to 1% of the UI. Similarly for other small fractional frequency differences, one can resolve the degree of jitter to that fraction of a UI.

The amount of errors a data pattern output from decoder 60 to data processor 62 is detected by data processor 62. The data processor can detect also the character of these errors. By the amount of errors, it can be determined how much jitter there is in the transmitter 48 and/or the interface 58. By the character of these errors, it is possible to determine PWD (Pulse Width Distortion), if there is any time dependence, etc. One of ordinary skill in the art can appreciate that, in embodiments, certain functions discussed above for data processor 62 and 52 may be accomplished external to either tester 50 or transmitter 48. Further, one of ordinary skill in the art can appreciate other modifications of the components of tester 50 and transmitter 48 can be made to accomplish the same principle operation. One technique is to record the data stream expected and the data pattern received as a pair of data files that are then processed by software that does a detailed comparison between these two files.

Figure 5B:
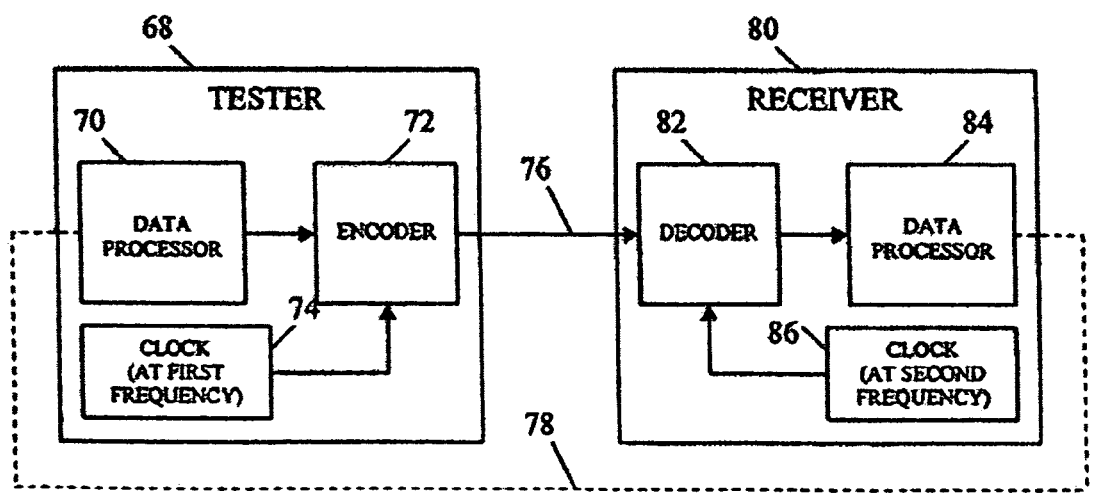

FIG. 5B is similar to example FIG. 5A, however, receiver 80 is coupled to tester 68 through interface 76. In example FIG. 5B, a test data pattern is output from data processor 70 into encoder 72 and encoded according to the frequency of clock 74. Because there is communication between data processor 70 of tester 68 and data processor 84 of receiver 80, the frequency of clock 74 can be set at a different frequency than clock 86. Accordingly, the test data pattern transmitted over interface 76 is decoded at decoder 82 at a different frequency than it was encoded. The decoded data pattern signal is input into data processor 84. The data pattern is then sent back to data processor 70 for comparison. Based on the amount of errors in the data pattern, the amount of jitter of receiver 80 and/or interface 76 can be determined in a relatively short period of time. Similar to FIG. 5A, one of ordinary skill in the art would appreciate that interface 76 may include at least one passive and/or active communication component.

Figure 5C:
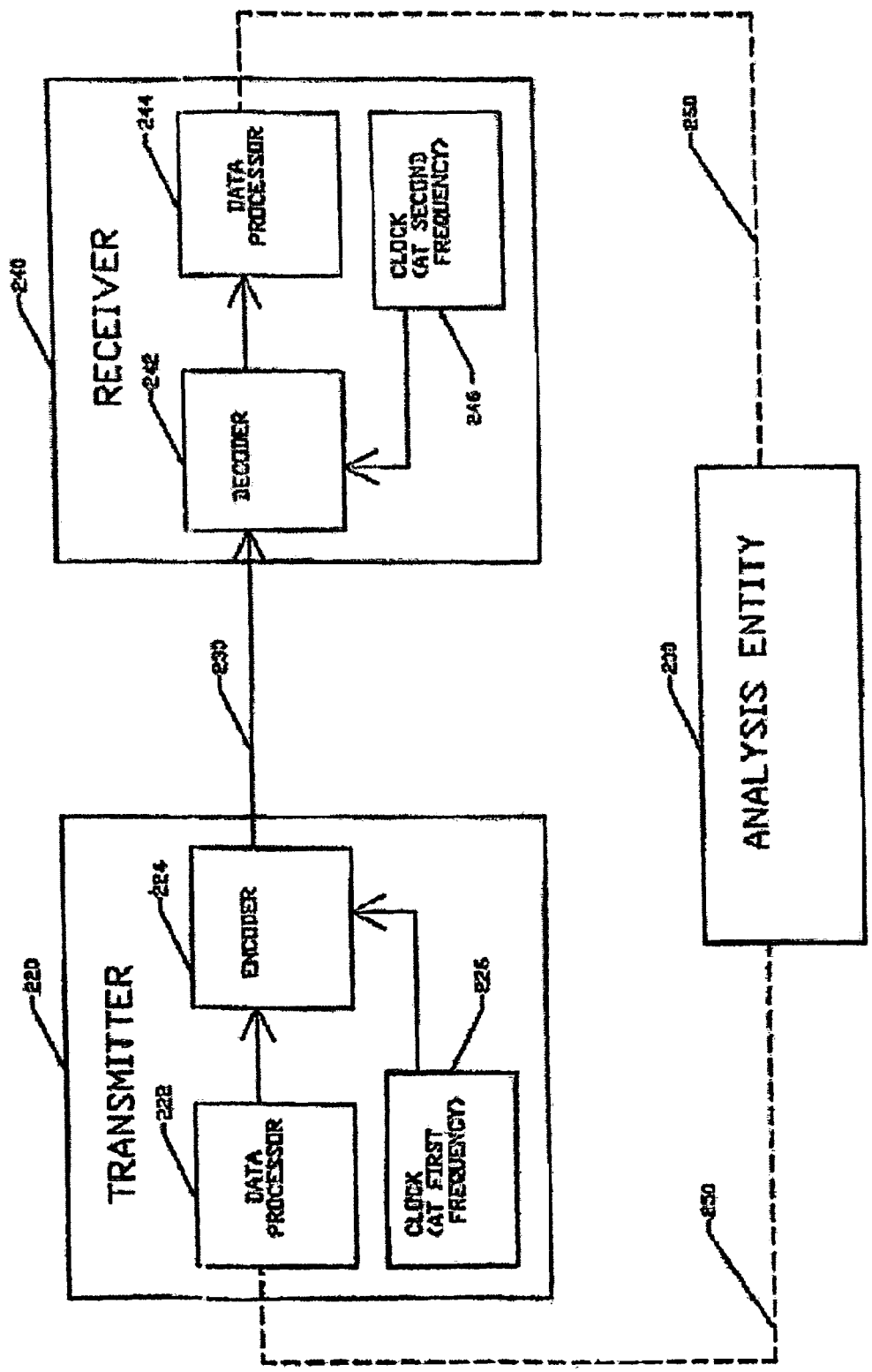

FIG. 5C shows a separate analysis device 200 in accordance with an illustrative embodiment. The entity 200 is used to analyze the jitter in the communication subsystem comprising the transmitter 220, the communications link 230 (which may include media, amplifiers, couplers and other passive and active communications devices) and receiver 240. The data processor 222 is primarily responsible in providing the data pattern to be encoded in encoder 224. The data processor 244 is primarily responsible for collecting the sampled data that is decoded in 242. Clock 226 controls the rate of encoding by encoder 224 and clock 246 controls the sampling rate of decoder 242.

The analysis device 200 communicates with data processor 222 via the communications path 250. The entity 200 knows the data pattern that processor 222 is delivering to encoder 224, either because it is informed by processor 222 or because it specifies the pattern for processor 222 to use. In addition, device 200 learns from data processor 244 via communications path 260 the sampled data stream.

Optionally, also there may be control by or information to analysis device 200 of the clock rates of clock 226 and clock 246. For example, 200 may want to assure that the rates are 1% different from each other.

The analysis device 200 can compare the two data streams (transmitted and received) and looks for regions of exact matches as described later. This comparison can be used to determine the jitter and its character.

Figure 6A:
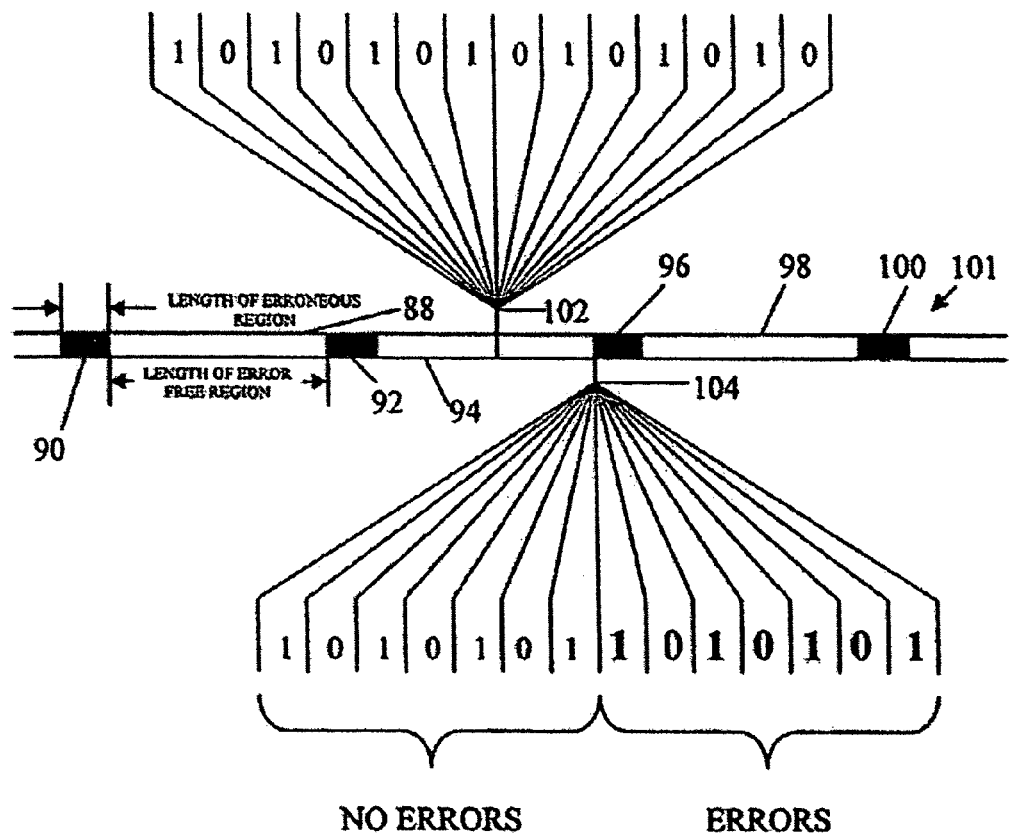
FIGS. 6A-6C are schematic diagrams of data patterns with both error-free regions and erroneous regions according to example embodiments.
Figure 6B:
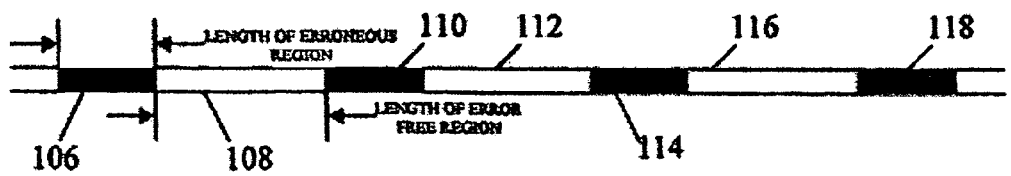
Figure 6C:
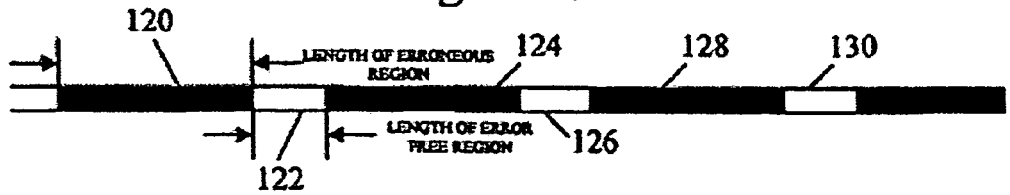

FIGS. 6A-6C are example illustrations of data patterns decoded at a different frequency than they were encoded. In FIG. 6A, for simplification, the test data pattern is "10101010101010", which is alternating "1"s and "0"s. This can be shown by section 102 of decoded data pattern 101. Because of differences in clock cycle, segments 90, 92, 96, and 100 of data pattern 101 contain erroneous data. Likewise, segments 88, 94, and 98 are error-free regions that are not affected by the difference in clock frequency of an encoder and a decoder. Section 104 illustrates a transition between an error-free region and an erroneous region. As illustrated, the first part of portion 104 is alternating "1"s and "0"s. However, the second part of portion 104, the data bits are still alternating "1"s and "0"s, but they are out of phase by one bit. This can be easily seen by two "1"s being next to each other in a row.

In the example embodiment of FIG. 6A, the relatively short length of the erroneous regions 90, 92, 96, and 100 in relation to the relatively long length of the error-free regions 88, 94, and 98 are assuming that the device under test has little jitter. In other words, because of the difference in clock frequency of the encoder and decoder, there are naturally some erroneous regions (jumps from one error-free patch to the next). These erroneous regions are easily detectable, because they occur on a periodic and measurable basis. This period may be determined from knowing the frequency difference fo the clock1 and clock2, or the period may be determined upon examination of the data and be used to state the difference that exists between the frequencies of clock1 and of clock2. One of ordinary skill in the art will appreciate that not every bit of the bit pattern needs to be sampled in order to determine the distribution of erroneous regions. For example, for processing simplicity, every other bit or every fourth bit, could be sampled in order to determine a relative length of erroneous regions 90, 92, 96, and 100. In example embodiments, a test data pattern may be a pseudo random bit sequence (PRBS). Through experimentation or theoretical calculation, the ratio of the length of erroneous regions to the length error-free regions as a function of clock cycles can be used to determine the amount of jitter in a system. Some aspects of the jitter may be ascertained also. For example, one form of jitter is due to PWD (Pulse Width Distortion) which will show up as the errored regions containing unequal amounts of 1→0 errors compared to 0→1 errors.

FIGS. 6A, 6B, and 6C show different ratios of the length of erroneous regions and the length of error-free regions. FIG. 6A has the largest error-free regions (and the smallest error regions). FIG. 6B is intermediate by having larger error regions. FIG. 6C is the worst jittered because the errored regions are the largest in comparison to its error-free regions. The jitter in UI is the ratio: (error-region length)/((error-region length)+(error-free-region length)). Because a tester is purposely set to encode or decode a test data pattern at a clock frequency different than a device under test (DUT), the increase of this erroneous region is a measurable quantity which indicates a specific amount of jitter in a system.

In exemplary FIG. 6C, it is illustrated that erroneous regions 120, 124, and 128 are larger than error-free regions 122, 126, and 130. This ratio may indicate significant jitter in a device under test (DUT). One of ordinary skill in the art would appreciate that the clock difference in a device under test (DUT) and the tester has an impact on the resolution of the erroneous region. Accordingly, one of ordinary skill in the art can determine what difference in clock frequency would be appropriate to set an appropriate resolution to test jitter.

Figure 7:
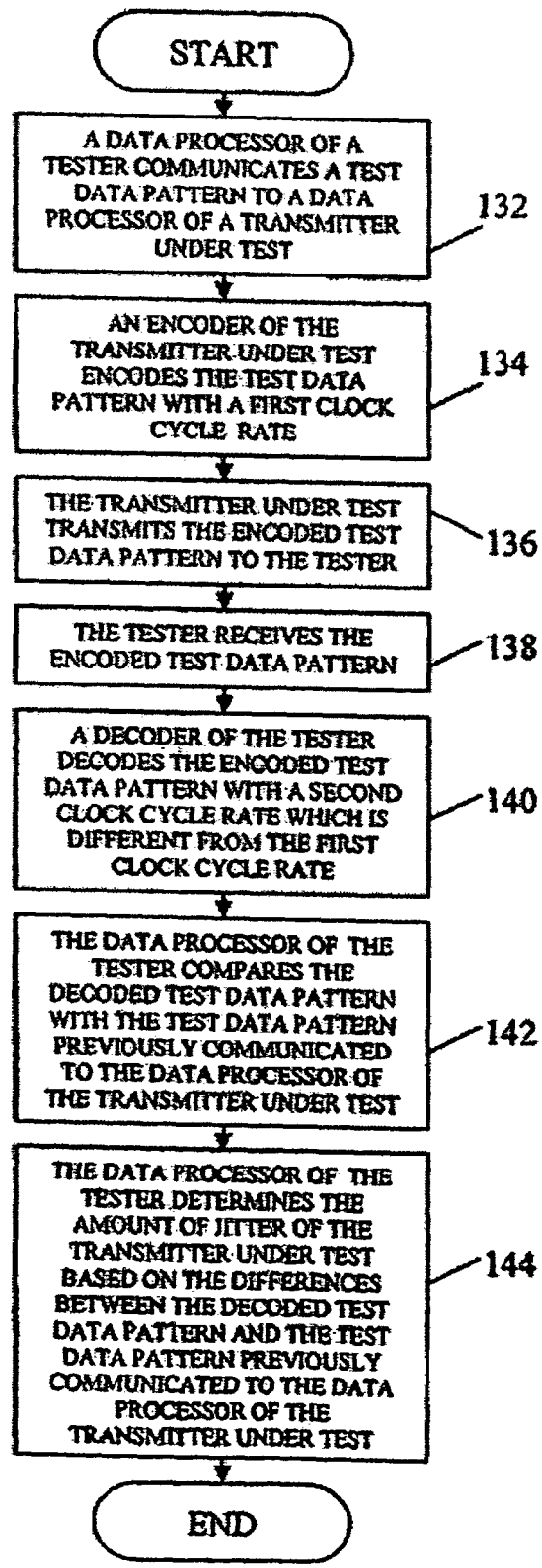
FIG. 7 is an exemplary flowchart of a method utilized by testers according to example embodiments.

FIG. 7 is an exemplary flowchart illustrating a protocol of a tester that is testing a transmitter. In block 132, a data processor of a tester may communicate a test data pattern to a data processor of a transmitter under test. In block 134, an encoder of a transmitter under test may encode the test data pattern with a first clock cycle rate. In block 136, the transmitter under test may transmit the encoded test data pattern to the tester. In block 138, the tester may receive the encoded test data pattern. In block 140, a decoder of the tester may decode the encoded data pattern with a second clock cycle rate which is different from the first clock cycle rate. In block 142, the data processor of the tester may compare the decoded test data pattern with the test data pattern previously communicated to the data processor of the transmitter under test. In block 144, the data processor of the tester may determine the amount of jitter of the transmitter under test based on the differences between the decoded test data pattern and the test data pattern previously communicated to the data processor of the transmitter under test.

Figure 8:
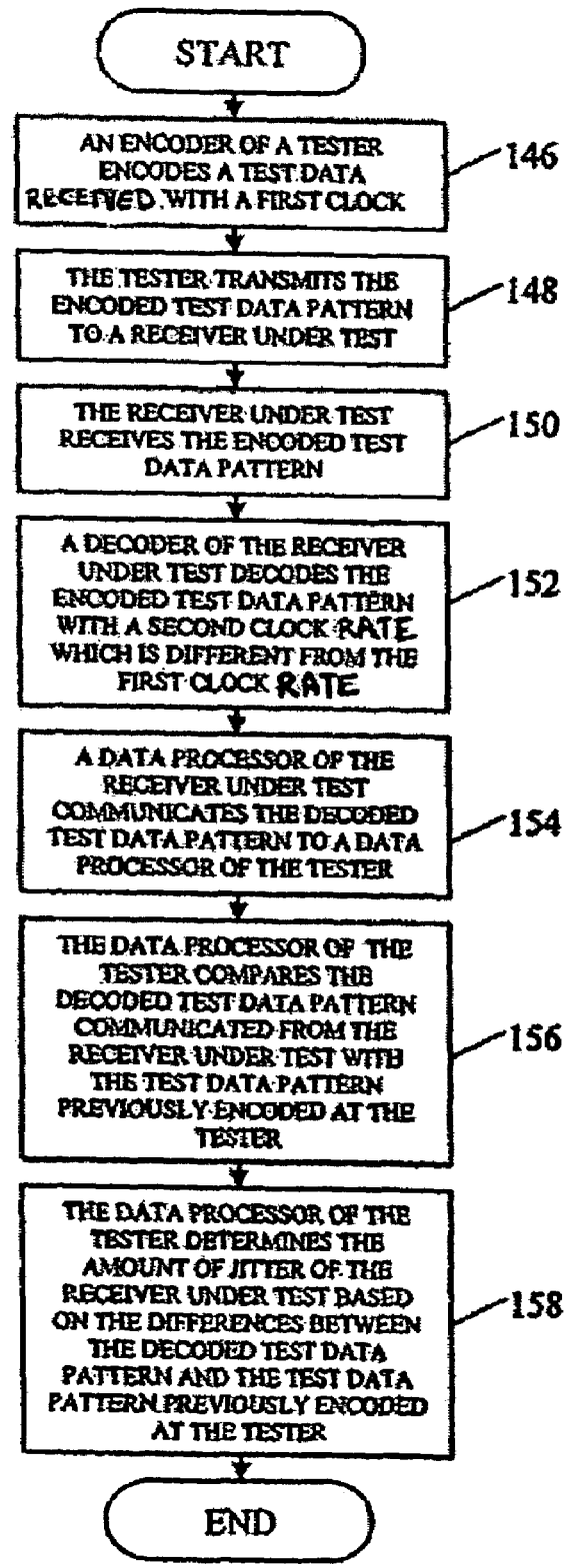
FIG. 8 is an exemplary flowchart of a method utilized by testers according to example embodiments.

The exemplary flowchart of FIG. 8 is similar to the exemplary flowchart of FIG. 7. However, it is applied when the device under test (DUT) which exercises a different clock cycle is a receiver. In block 146, an encoder of a tester may encode a test data pattern with a first clock cycle rate. In block 148, the tester may transmit the encoded test data pattern to a receiver under test. In block 150, the receiver under test may receive the encoded test data pattern. In block 152, a decoder of the receiver under test may decode the encoded test data pattern with a second clock cycle rate, which is different from the first clock cycle rate. In block 154, a data processor of the receiver under test may communicate the decoded test data pattern to a data processor of the tester. In block 156, the data processor of the tester may compare the decoded test data pattern communicated from the receiver under test with the test data pattern previously encoded at the tester. In block 158, the data processor of the tester may determine the amount of jitter of the receiver under test based on the differences between the decoded test data pattern and the data pattern previously encoded at the tester. It may determine also other characteristics of the jitter.

Figures 9A, 9B, 9C, 9D, 9E, 9F, 9G:
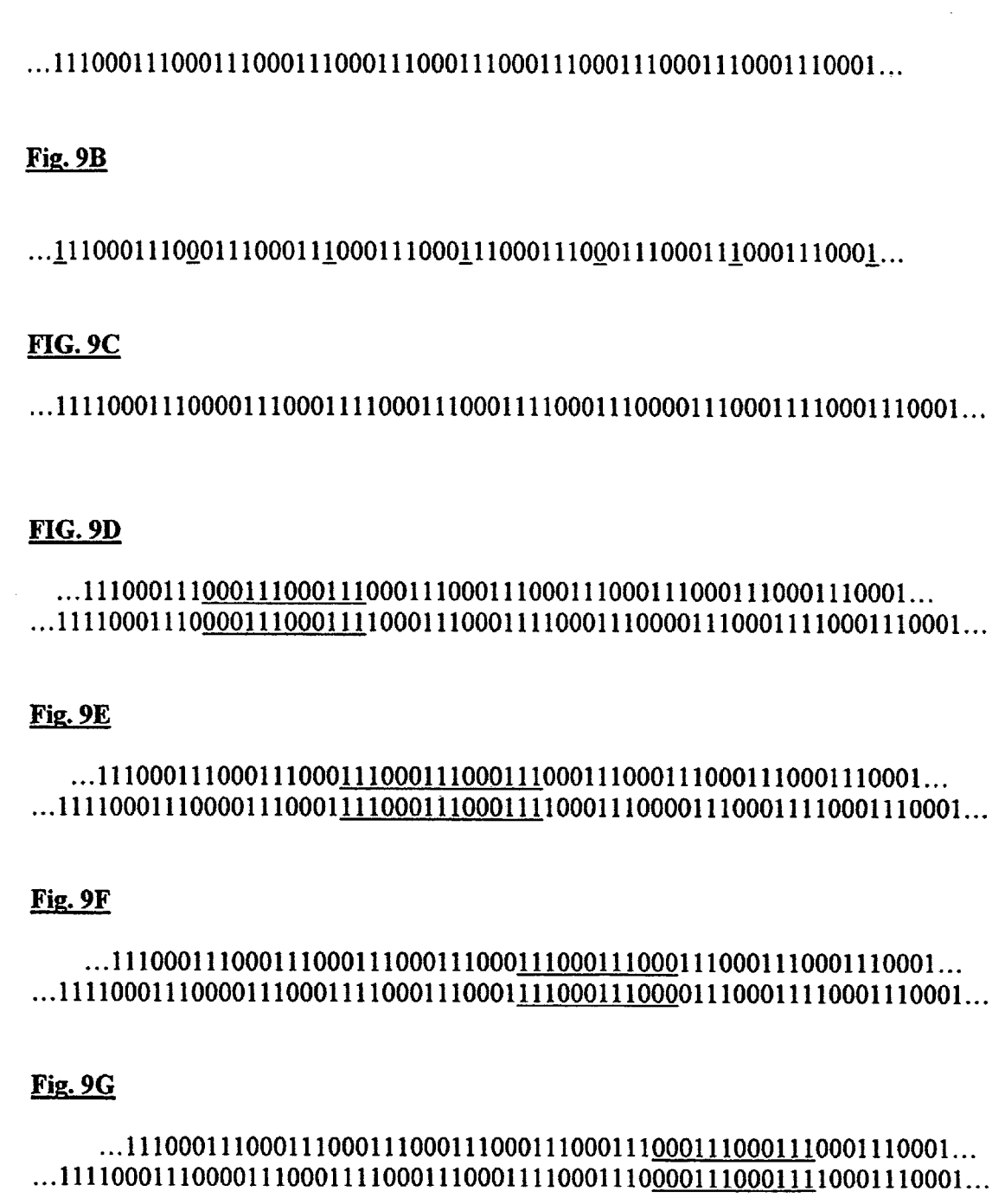

In order to illustrate additional aspects of the example embodiment, a data pattern is considered that consists of alternating triplets of 1's and of 0's. An example of such a pattern is shown in FIG. 9A as the reference pattern. The pattern of FIG. 9A is chosen here to illustrate more aspects than can be shown with the previously described "101010 . . ." pattern, but it is not necessary that the pattern be of fixed run lengths of 1's and of 0's. It could be a pseudo-random bit sequence (PRBS), live data, or something that the user has chosen for other reasons. The example pattern here is chosen for illustrative convenience. It is emphasized that pattern shown in FIGS. 9A-10H are portions of a much greater pattern.

If the data are being sampled at a higher data rate than the rate the data are transmitted, there should be more data samples in a given amount of time than the number of bits transmitted. This is called "over-sampling". Again, for illustrative convenience, approximately 10% over-sampling is illustrated in FIG. 9B; a more typical value in practice might be approximately 1% over-sampling. With approximately 10% over-sampling, about every $10^{th}$ transmitted bit is sampled twice because that bit is sampled close to the start of its bit interval and again nearly at the end of that same bit interval (thus it is sampled 2 times). FIG. 9B illustrates, by underlining, a possible set of bits in the reference pattern that are sampled twice.

FIG. 9C illustrated the sampled set of bit values that result from this over-sampling. It is assumed that the jitter in the system is negligible in this example.

FIGS. 9D-9G illustrate places where the reference pattern and the sampled pattern match significantly. Each of these matches are long enough that they are not considered "random" or "lucky". If one matches an isolated 1 in both, it would be very unconvincing. Even a match of 10 successive bits is not as convincing as one would like because that could happen about 0.1% by random chance. For 20 bits to exactly match would occur about once every million random match attempts and would be more convincing and a run of 30 bits to match would occur by random chance only about once in a billion times. Thus the advantage of working with nearly equal clock rates so that the clock slips are not likely to occur for, say, regions of 30 bits and so such long regions of exact matches are likely to occur and not by random chance. It is for purposes of illustration that the example with this approximately 10% over-sampling is shown.

It is convincing here that the matches are not random because the regions of apparent good matches are found in approximately uniform progression, as seen by the underlined regions moving from left to right by approximately equal amounts going from FIG. 9D through FIG. 9G where a slight successive relative positioning is done for the reference and sampled sequences.

These matching regions can be equated with the "error free regions" of FIGS. 6A-6C. If one looks for regions between these error free regions, one discovers that they may not exist because the error free regions may overlap. An example of overlap of these regions can be seen, for example, with the right edges of FIG. 9D with the left edges of FIG. 9E.

The example presented here is where jitter is negligible, it is observed that the error free regions are never shorter than the period between slips, but can be longer. The reason that the region can be longer is that a slip cannot be detected until an "edge" is encountered. An edge is where successive bits are of opposite types, such as with the pairs: 01 and 10. This is understood in that all 0's look alike so until a 1 is encountered, comparing two runs of 0's will look identical. Similarly, comparing two runs of 1's will not show any differences until a 0 is encountered. The edges of error free regions are randomly extended by the occurrence of long runs of a given bit type.

By superimposing the results of many error free regions, the eye width of the transmission link is more accurately determined. This is because the eye-width is less than or equal to all of the observed error-free regions (some of the error free regions may be extended by the long runs in the data pattern).

FIGS. 10A-10H use the same reference example pattern as in FIGS. 9A-9G, but illustrate the case where the sampled data pattern is generated by under-sampling. In under-sampling, the data-sampling clock is running at a slower rate than the data clock. Consequently, an occasional reference pattern bit is never sampled; this occurs when a bit is sampled almost at the end of its interval so that the next sample skips over a bit interval and samples near the start of the following bit interval.

FIG. 10A is the original reference pattern; it is the same as the one in FIG. 9A except we show a little more of it.

FIG. 10B shows an example of which bits in the pattern will be lost in the under-sampling process. This bit loss is summarized in the sampled pattern shown in FIG. 10C.

FIGS. 10D-10H show a sequence of matches obtained by slight repositioning of the sampled pattern relative to the reference pattern. In this example, super-positioning the error-free regions results in an eye opening of 10 sample or bit intervals. The successive locations of error-free regions moves about 10 bit intervals in the reference pattern, thus the eye opening is approximately 100% and thus the measured jitter is negligible. Generally, the fractional eye opening is determined by the width of the superimposed error free regions (in bit intervals) compared to the average slip interval (also in bit intervals).

Where the pattern is this complicated, it is easy to distinguish the over-sampled case from the under-sampled case. Successive matches used to form the error-free regions are spaced further apart on the sequence with the higher clock rate. The slip-rate interval, the average number of bit samples between error-free interval centers is the inverse of the fractional frequency difference. In the two examples illustrated in FIGS. 9A-9G and 10A-10H, the slip-rate interval is 10 bits and the fractional frequency difference is therefore 10%. If the slip-rate interval had been 100 bits, the fractional frequency difference would have been 1%.

If the jitter had not been negligible, at least some of the error-free regions would be narrower. Comparing the observed width of the superimposed error-free regions to the observed slip interval would indicate the fractional eye width. The peak-to-peak jitter in UI is the difference of the fractional eye-width from unity.

The comparison of the reference pattern and the sampled pattern can be done from memory or file images and so need not be "real time". One can respond to questions or perform additional analysis of the jitter automatically. A typical need that can be satisfied is to concentrate upon the most extreme jitter cases observed. The most extreme jitter is identified with the most extreme excursions of the error-free regions. In the analysis, the time and/or position in the pattern can be noted and nearby data features noted. This way, time-dependent jitter and pattern-dependent jitter can be studied.

One form of jitter is pulse-width distortion (PWD). It is characterized by the average position of rising edges shifted with respect to the average position of falling edges. When the rising edges (0→1) are delayed with respect to falling edges (1→0), the intervals for sequences for 1 are shortened and the intervals for sequences for 0 are lengthened. Conversely, when the rising edges (0→1) are advanced with respect to falling edges (1→0), the intervals for sequences for 1 are lengthened and the intervals for sequences for 0 are shortened. In the analysis here, PWD can be studied by comparing the error-free regions defined where errors are only counted when 0→1 compared to error-free regions defined where errors are only considered when 1→0.

In accordance with illustrative embodiments, methods and apparati for determining jitter have been described in conjunction with example embodiments. It is emphasized that the various methods, components, parameters and applications of the methods and apparati are included by way of example only and not in any limiting sense. Therefore, the embodiments described are illustrative and are useful in providing useful jitter determination. In view of this disclosure, those skilled in the art can implement the various example devices and methods determine jitter, while remaining within the scope of the appended claims.

What is claimed is:

1. A tester comprising:
    a receiver that receives a signal, comprising a first data pattern, generated at a first bit rate of a first clock; and
    an analysis device, which samples the signal at a test bit rate of a test clock to generate a second data pattern, the test bit rate differing from the first bit rate by a selected amount;
    wherein the analysis device compares the first data pattern and the second data pattern to determine differences between the first data pattern and the second data pattern; and
    wherein the analysis device determines jitter characteristics in the signal according to the differences between the first data pattern and the second data pattern by:
        aligning the first data pattern and the second data pattern to maximize a number of matching bits;
        identifying matching regions between the first data pattern and the second data pattern;
        identifying non-matching regions between the first data pattern and the second data pattern;
        determining an average length of the non-matching regions; and comparing the average length of the non-matching regions with an expected length of the matching regions when no jitter exists.

2. The tester of claim 1, wherein the first bit rate is different from the test bit rate also due to jitter.

3. The tester of claim 1, wherein a percentage of bits are different between the first data pattern and the second data pattern at given positions in a slip period between the test clock and the first clock.

4. The tester of claim 1, wherein the second data pattern is alternating 1s and 0s.

5. The tester of claim 1, wherein the second data pattern is a pseudo random bit sequence.

6. The tester of claim 3, wherein a period of the second bit rate is different from a period of the first bit rate by approximately 1%.

7. The tester of claim 1, wherein a period of the second bit rate differs from a multiple of the first bit rate by about 1%.

8. The tester of claim 1, wherein a period of the second bit rate differs from a submultiple of a period of the first bit rate by about 1%.

9. The tester of claim 1, wherein the signal was generated at a device under test.

10. The tester of claim 1, wherein the device under test is a communication device.

11. The tester of claim 10, wherein the device under test is an optical communication device.

12. The tester of claim 1, wherein the first data pattern is a predetermined data pattern.

13. The tester of claim 1, wherein a period of the second bit rate is different from a period of the first bit rate by at least 0.01% and less than approximately 5%.

* * * * *